US012411600B2

(12) United States Patent
Omori

(10) Patent No.: US 12,411,600 B2
(45) Date of Patent: Sep. 9, 2025

(54) TOUCH PANEL

(71) Applicant: DISCO CORPORATION, Tokyo (JP)

(72) Inventor: Takafumi Omori, Tokyo (JP)

(73) Assignee: DISCO CORPORATION, Tokyo (JP)

( * ) Notice: Subject to any disclaimer, the term of this patent is extended or adjusted under 35 U.S.C. 154(b) by 24 days.

(21) Appl. No.: 18/538,063

(22) Filed: Dec. 13, 2023

(65) Prior Publication Data

US 2024/0134518 A1 Apr. 25, 2024
US 2024/0231608 A9 Jul. 11, 2024

Related U.S. Application Data

(62) Division of application No. 17/660,875, filed on Apr. 27, 2022, now abandoned.

(30) Foreign Application Priority Data

May 20, 2021 (JP) .................. 2021-085150

(51) Int. Cl.
*G06F 3/04886* (2022.01)
*G06F 3/0482* (2013.01)
*H01L 21/67* (2006.01)

(52) U.S. Cl.
CPC ........ *G06F 3/04886* (2013.01); *G06F 3/0482* (2013.01); *H01L 21/67092* (2013.01)

(58) Field of Classification Search
CPC .. G06F 3/0482; G06F 3/04817; G06F 3/0488; G06F 3/04842; G06F 3/0416; G06F 3/0484; B28D 5/0058; B28D 5/0064; B28D 5/0082; H01L 21/67092
See application file for complete search history.

(56) References Cited

U.S. PATENT DOCUMENTS

| 10,296,128 | B1 | 5/2019 | Nold et al. |
| 2012/0200414 | A1 | 8/2012 | White et al. |
| 2013/0227490 | A1 | 8/2013 | Thorsander et al. |
| 2014/0028885 | A1* | 1/2014 | Ma ...................... H04N 23/635 |
| | | | 348/E5.022 |
| 2014/0177396 | A1 | 6/2014 | Lee et al. |
| 2015/0256758 | A1 | 9/2015 | Gao et al. |

(Continued)

FOREIGN PATENT DOCUMENTS

| JP | 10203197 A | 8/1998 |
| JP | 2006156809 A | 6/2006 |

(Continued)

OTHER PUBLICATIONS

Office Action issued in counterpart Singapore patent application No. 10202204310R, dated Aug. 14, 2024.

(Continued)

*Primary Examiner* — Jeanette J Parker
(74) *Attorney, Agent, or Firm* — Greer Burns & Crain Ltd.

(57) ABSTRACT

There is provided a touch panel that displays an image in which a plurality of functional buttons are arranged. The plurality of buttons include a long-touch button a function of which can be rendered active after the button is continuously touched for a predetermined time period, and attendant on the long-touch button, a count-down signal notifying a time period remaining before a timing at which the function can be rendered active is displayed.

8 Claims, 3 Drawing Sheets

(56) References Cited

U.S. PATENT DOCUMENTS

| | | | |
|---|---|---|---|
| 2016/0078583 A1* | 3/2016 | Nishitani | G06T 1/0014 |
| | | | 348/207.1 |
| 2016/0078750 A1 | 3/2016 | King et al. | |
| 2016/0342308 A1 | 11/2016 | Aggarwal | |
| 2018/0181293 A1* | 6/2018 | Dare | G06F 3/04812 |
| 2021/0117077 A1 | 4/2021 | Fujibayashi | |
| 2021/0375489 A1* | 12/2021 | Tsushita | G16H 20/60 |
| 2021/0398402 A1 | 12/2021 | Richards et al. | |

FOREIGN PATENT DOCUMENTS

| | | | | |
|---|---|---|---|---|
| JP | 2006221568 A | | 8/2006 | |
| JP | 2012048283 A | | 3/2012 | |
| JP | 2014041938 A | * | 3/2014 | |
| JP | 2014123374 A | | 7/2014 | |
| JP | 2016115073 A | * | 6/2016 | |
| JP | 2016220847 A | | 12/2016 | |
| JP | 2020013462 A | | 1/2020 | |
| JP | 2020161015 A | * | 10/2020 | |
| TW | 201707904 A | * | 3/2017 | H01L 21/78 |

OTHER PUBLICATIONS

Office Action issued in counterpart Japanese patent application No. 2021-085150, dated Nov. 19, 2024.

\* cited by examiner

TOUCH PANEL

This is a Divisional application of application Ser. No. 17/660,875 filed Apr. 27, 2022, which claims the benefit of Japanese Patent Application No. 2021-085150, filed on May 20, 2021.

BACKGROUND OF THE INVENTION

Field of the Invention

The present invention relates to a touch panel configured to display an image in which a plurality of buttons are arranged.

Description of the Related Art

A wafer having a front surface on which a plurality of devices such as integrated circuits (ICs) and large scale integration (LSI) circuits are formed in respective areas partitioned by planned division lines is divided into individual device chips by a dicing apparatus, and the device chips are used for electrical appliances such as mobile phones and personal computers.

The dicing apparatus generally includes a cassette accommodating a plurality of wafers, an unloading mechanism that unloads a wafer from the cassette onto a temporary placement table, a transferring mechanism that transfers the wafer unloaded onto the temporary placement table to a chuck table, an imaging unit that images the wafer transferred to the chuck table to detect a region to be divided, a cutting unit that cuts the wafer along the planned division lines, a cleaning unit that cleans the cut wafer, a control unit that controls the respective operation means, and a touch panel through which processing conditions and wafer information are inputted to the control unit, and can divide the wafer into individual device chips with high accuracy (see, for example, Japanese Patent Laid-open No. 2006-156809).

SUMMARY OF THE INVENTION

In the case of confirming the processing conditions for wafers or confirming the wafer information, for example, during operation of the dicing apparatus, an operator is supposed to touch a desired button such as a "processing condition confirmation button" or a "wafer information button" among a plurality of buttons displayed on a menu screen of the touch panel. However, if the operator touches any of other buttons such as a "cutting blade replacement button" by mistake, the operation of the dicing apparatus is suspended, and a recovery operation is required. As a result, productivity is lowered. Such a problem can occur not only in the dicing apparatus but also in other apparatuses provided with a touch panel such as a laser processing apparatus or a grinding apparatus.

Accordingly, it is an object of the present invention to provide a touch panel that can solve the problem that the productivity of an apparatus in which the touch panel is disposed is lowered due to an erroneous touch of a button on the touch panel.

In accordance with an aspect of the present invention, there is provided a touch panel that displays an image in which a plurality of functional buttons are arranged. The plurality of functional buttons include a long-touch button a function of which can be rendered active after the button is continuously touched for a predetermined time period, and attendant on the long-touch button, a count-down signal notifying a time period remaining before a timing at which the function can be rendered active is displayed.

Preferably, the function is rendered active in a case in which the timing has come and a finger is moved away from the long-touch button, the function is not rendered active in a case in which the finger is moved away from the long-touch button before the timing comes, and the function is not rendered active in a case in which the timing has come, the finger is slid from the long-touch button without being moved away from the touch panel, and the finger is moved away from the touch panel at a position spaced from the long-touch button. In addition, preferably, a length of the time period remaining before the timing comes changes every time the long-touch button is touched. Besides, preferably, a color of the count-down signal changes every time the long-touch button is touched. Further, preferably, the count-down signal is displayed in such a manner as to go around the long-touch button.

The touch panel according to the aspect of the present invention is a touch panel that displays an image in which a plurality of functional buttons are arranged. The plurality of functional buttons include a long-touch button a function of which can be rendered active after the button is continuously touched for a predetermined time period, and attendant on the long-touch button, a count-down signal notifying a time period remaining before a timing at which the function can be rendered active is displayed. Therefore, in an apparatus in which the touch panel is adopted, a count-down signal is displayed concerning a button which is normally not touched during operation of the apparatus, to thereby draw the operator's attention. As a result, the problem that the productivity of the apparatus in which the touch panel is disposed is lowered due to an erroneous touch of a functional button is solved, and stressed feelings that could be caused by the erroneous touch of the functional button can be avoided.

In addition, in the case where the length of the time period of the count-down by the count-down signal or the color displayed is changed, a stimulus can be given to the operator, and an erroneous operation that could happen because the operator gets used to operating the touch panel or because of the operator's habit, for example, can be prevented.

The above and other objects, features and advantages of the present invention and the manner of realizing them will become more apparent, and the invention itself will best be understood from a study of the following description and appended claims with reference to the attached drawings showing preferred embodiments of the invention.

DETAILED DESCRIPTION OF THE PREFERRED EMBODIMENTS

Embodiments of the present invention will be described in detail below with reference to the attached drawings.

Figure 1:
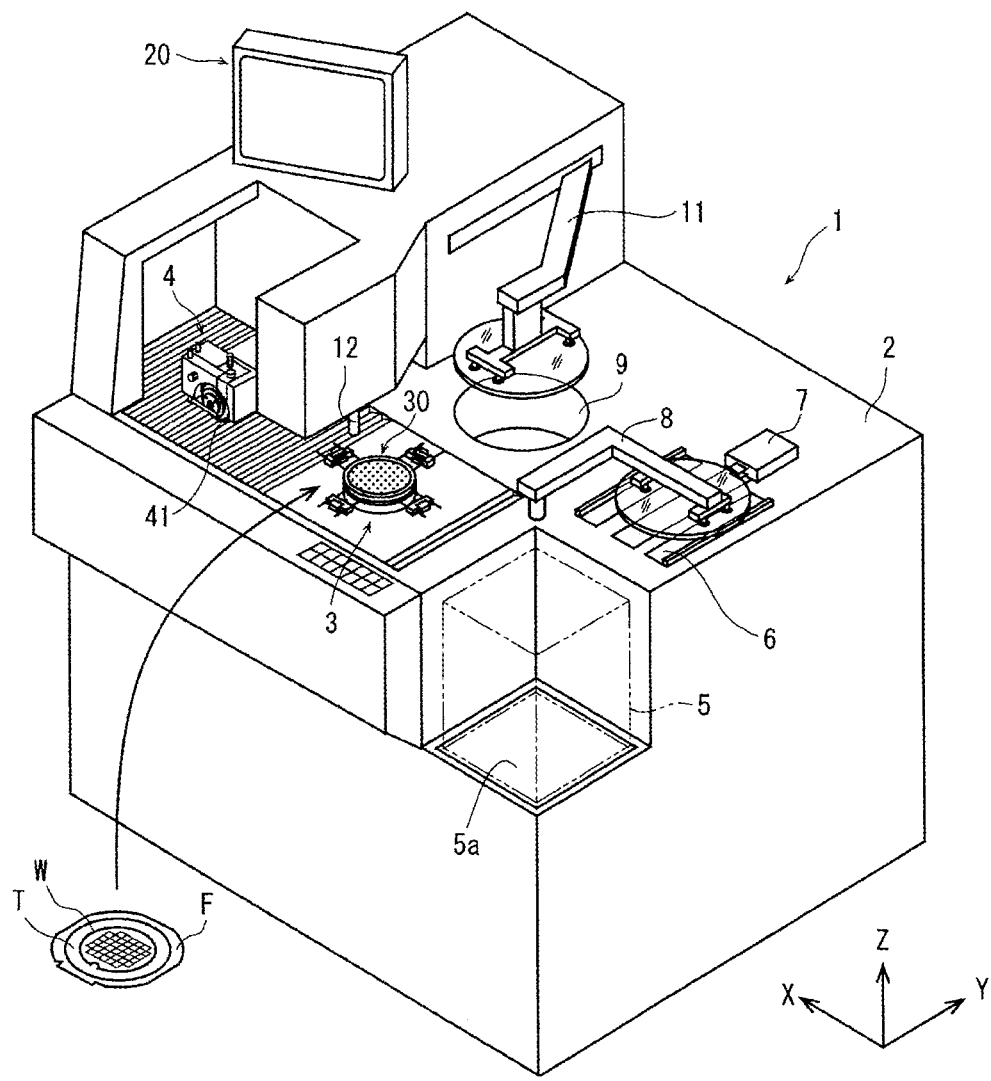
FIG. 1 is a general perspective view of a dicing apparatus in which a touch panel according to an embodiment of the present invention is disposed.

FIG. 1 depicts a dicing apparatus 1 to which a touch panel 20 according to an embodiment is applied. The dicing apparatus 1 in the embodiment depicted includes an apparatus housing 2 in a substantially rectangular parallelepiped shape, and includes a chuck table mechanism 3 disposed as a holding unit that holds a wafer W as a workpiece, and a cutting unit 4 having a cutting blade 41 for cutting the wafer W held by the chuck table mechanism 3. Note that, as depicted in the figure, the wafer W to be processed in the present embodiment is a substantially disk-shaped semiconductor wafer, on a front surface of which a plurality of devices are formed in respective areas partitioned by planned division lines, and is supported on an annular frame F through an adhesive tape T.

Further, the dicing apparatus 1 includes a cassette 5 (indicated by alternate long and two short dashes lines) accommodating a plurality of wafers W, a temporary placement table 6 on which a wafer W unloaded from the cassette 5 is temporarily placed, an unloading/loading mechanism 7 that unloads the wafer W onto the temporary placement table 6, a transferring mechanism 8 that turns to transfer the wafer W unloaded on the temporary placement table 6 onto the chuck table mechanism 3, a cleaning unit 9 (details omitted) that cleans the wafer W cut by the cutting unit 4, a cleaning transferring mechanism 11 that transfers the cut wafer W from the chuck table mechanism 3 to the cleaning unit 9, an imaging unit 12 that images the wafer W on the chuck table mechanism 3, and a control unit omitted in the figure. The cassette 5 is placed on a cassette table 5a disposed to be vertically movable with use of a lifting mechanism not illustrated, and at the time of unloading the wafer W from the cassette 5 by using the unloading/loading mechanism 7, the height of the cassette 5 is appropriately adjusted.

In the apparatus housing 2, an X-axis direction feeding mechanism (illustration omitted), which is means for processing-feeding the chuck table mechanism 3 and the cutting unit 4 relative to each other, for moving the chuck table mechanism 3 in an X-axis direction indicated by an arrow X, i.e., a cutting-feeding direction, is disposed.

On the apparatus housing 2 of the dicing apparatus 1, the touch panel 20 is disposed as depicted in the figure. The touch panel 20 is connected to the control unit omitted in the figure. The control unit includes a computer, and each constituent element of the dicing apparatus 1 is controlled by the control unit. The touch panel 20 is capable of displaying various menus, and an operator can give an instruction to the dicing apparatus 1 by directly touching a screen of the touch panel 20.

Figure 2:
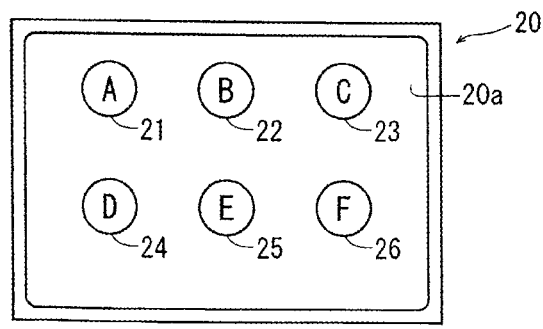
FIG. 2 is a menu screen of the touch panel when the dicing apparatus depicted in FIG. 1 is in operation.

FIG. 2 depicts a menu screen 20a at the time when the dicing apparatus 1 is performing a cutting operation. On the menu screen 20a, an image in which a plurality of circular functional buttons 21 to 26 are arranged is displayed. The functional buttons 21 to 26 include, for example, a functional button for displaying information concerning the wafer W being processed as a workpiece, a functional button for displaying current processing conditions, a functional button for displaying a state of the dicing apparatus 1, and a functional button for instructing an operation for replacing the cutting blade 41 to be used to cut the wafer W. Each of the functional buttons is given a character or a figure which indicates, in a simplified form, the function allocated to the functional button, as indicated by A to F in the figure (in the figure, A to F are depicted for convenience' sake for explanation, and may be different from actual display).

Figure 3:
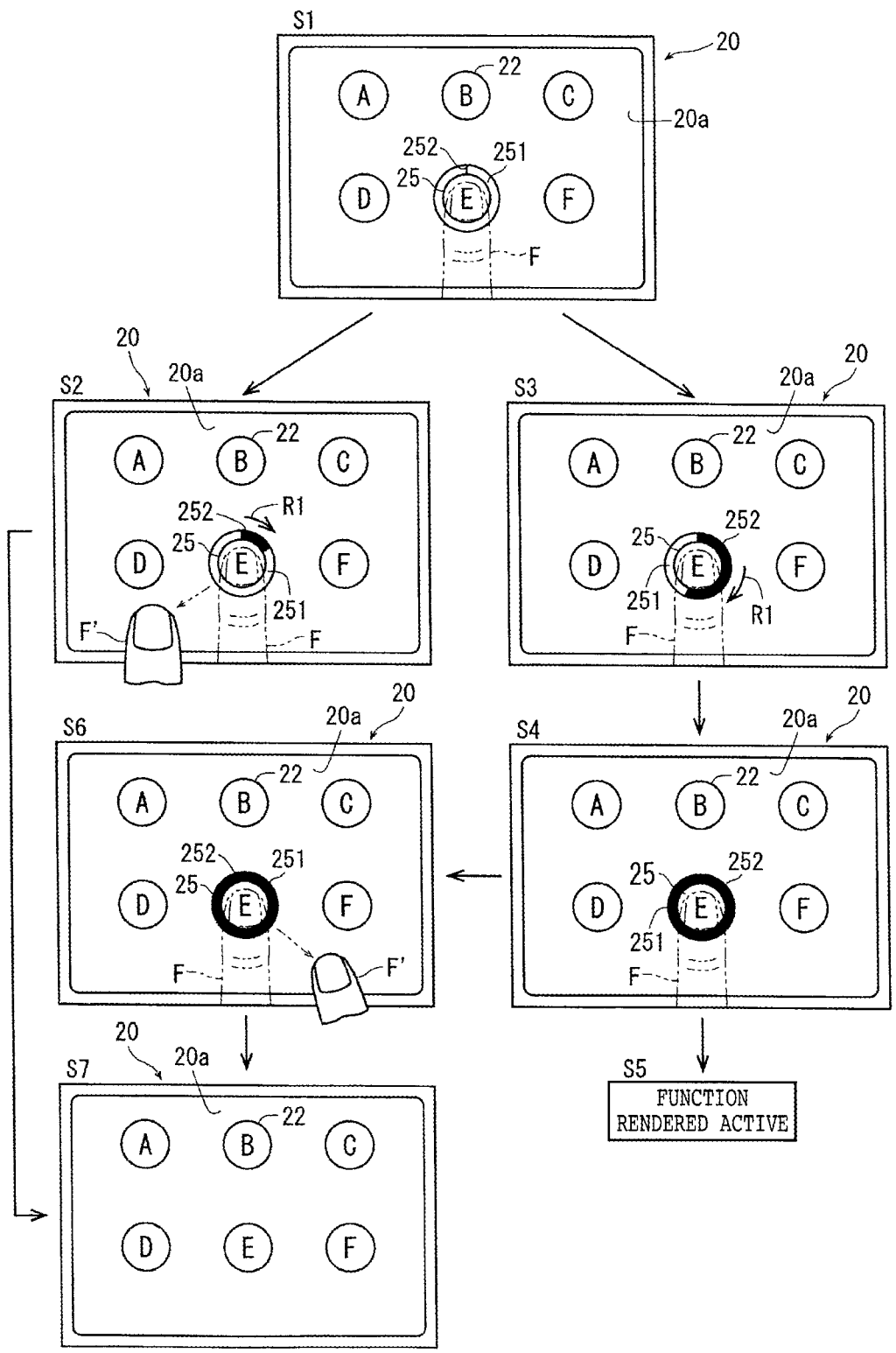
FIG. 3 is a conceptual diagram depicting how the touch panel depicted in FIG. 2 is operated.

Here, referring to a conceptual diagram of FIG. 3 depicting how the touch panel 20 is operated, an operation of the menu screen 20a of the touch panel 20 by the operator in charge of management of the dicing apparatus 1 will be described. First, description will be made of a case where, although the operator is supposed to touch the functional button 22 for displaying the processing conditions concerning the cutting being carried out by the dicing apparatus 1, the operator touches, by mistake, the functional button 25 to be touched when replacing the cutting blade 41.

FIG. 3 depicts, in step S1, a state in which an operator's finger F touches the functional button 25 displayed on the menu screen 20a of the touch panel 20. The functional button 25 in the present embodiment is a button to be touched to instruct an operation for replacing the cutting blade 41 as described above. When the function allocated to the functional button 25 is rendered active, the cutting being carried out by the dicing apparatus 1 is suspended, and the cutting unit 4 is moved to a predetermined position where to replace the cutting blade 41. Incidentally, the functional button 25 is a long-touch button of which the function is rendered active when the button is continuously touched for a predetermined time period, and therefore, even when the functional button 25 is touched, the function allocated to the functional button 25 is not immediately rendered active. A count-down signal display region 251 appears around the functional button 25 as indicated on the menu screen 20a of step S1 depicted in FIG. 3, and a count-down signal 252 for notifying the operator of a time period remaining before the timing at which the function of the functional button 25 can be rendered active appears at an upper part of the count-down signal display region 251.

Next, as depicted on the menu screen 20a in step S2 in the figure, in the count-down signal display region 251, the count-down signal 252 is gradually elongated in a direction indicated by an arrow R1 at a predetermined speed during the touch of the operator's finger F. Here, assume that the operator looks at the count-down signal 252 being elongated, recognizes that the functional button 25 is not the functional button 22 for displaying the processing conditions which button he or she wants to touch, and then moves the finger F away from the menu screen 20a as indicated by F' in step S2 in the figure. By this operation, the elongation of the count-down signal 252 is stopped, the count-down signal 252 and the count-down signal display region 251 disappear from the menu screen 20a as depicted in step S7 without allowing the function of the functional button 25 to be rendered active, and the cutting by the dicing apparatus 1 is continued. In other words, if the finger F is moved away from the functional button 25 which is a long-touch button before the timing at which the function can be rendered active comes, the function of the functional button 25 is not rendered active.

Next, a case where the operator intentionally touches the functional button 25 to instruct an operation for replacing the cutting blade 41 will be described. As depicted in step S1 in FIG. 1, even when the operator's finger F touches the functional button 25, since the functional button 25 is a long-touch button, the function allocated to the functional button 25 is not immediately rendered active. As depicted on the menu screen 20a in step S1, the count-down signal display region 251 appears around the functional button 25, and the short count-down signal 252 appears at the upper part of the count-down signal display region 251. Then, as depicted in step S3, in the count-down signal display region 251, the count-down signal 252 is gradually elongated at a predetermined speed in a direction indicated by an arrow R1 during the touch of the operator's finger F. The operator, while the count-down signal 252 is being elongated, recognizes that the functional button 25 he or she is touching is correct, and continues touching the functional button 25. In this way, the count-down signal 252 is elongated, and for example, after 10 seconds passes, the count-down signal 252 has gone around the count-down signal display region 251, namely, around the functional button 25 which is a long-touch button, and count-down by the count-down signal 252 is completed. Accordingly, the operator is visually notified that it is time to render the function of the functional button 25 active.

As described above, when the count-down by the count-down signal 252 is completed and the operator moves the finger F away from the functional button 25, the processing proceeds to step S5, and the function for replacing the cutting blade 41 can be rendered active. In other words, when the finger F is moved away from the functional button 25, which is a long-touch button, after the timing at which the function can be rendered active comes, the function of the functional button 25 is rendered active.

According to the present embodiment, as described above, since the functional button 25 is a long-touch button, the function allocated to the functional button 25 is not rendered active by only toughing the functional button 25, and therefore, the problem that the productivity of the apparatus in which the touch panel 20 is disposed is lowered due to an erroneous touch of a functional button is solved. Note that the present invention is not limited to only the functional button 25 being a long-touch button, but the other functional buttons 21 to 24 and 26 may be long-touch buttons. Further, in the present embodiment, a function to be described below can be additionally allocated to each functional button as required. Referring to FIG. 3, the additional function allocated to the functional button 25 will be described more specifically.

As described above, the functional button 25 is a long-touch button. The timing at which the function of the functional button 25 is rendered active after the count-down by the count-down signal 252 is completed is visually notified, and then the function can be rendered active. However, as the operator gets used to the work, he or she may forget to confirm whether or not he or she is touching a correct functional button in the course of elongation of the count-down signal 252, and he or she may recognize that he or she has been touching a wrong functional button at the timing at which the count-down by the count-down signal 252 is completed, namely, at the stage of step S4 in FIG. 3. In view of this, the present embodiment adopts a configuration in which the function allocated to the functional button 25 is not rendered active in the following case. Specifically, after the count-down by the count-down signal 252 is completed with the operator's finger F in touch with the functional button 25 as depicted in step S4 in FIG. 3, the operator slides the finger F sideways from the position of the functional button 25 as indicated by F' in step S6 in the figure while keeping the finger F in touch with the surface of the touch panel 20, and then moves the finger F' away from the surface at a position spaced from the functional button 25. In other words, after the timing at which the function can be rendered active has come, the finger F is slid from the functional button 25, which is a long-touch button, without being moved away from the touch panel 20, and then the finger F is moved away from the touch panel 20 at a position spaced from the functional button 25. In this case, the function of the functional button 25 is not rendered active.

According to the configuration described above, even from a state in which the functional button 25 has been touched long, in which the count-down by the count-down signal 252 is completed, and in which the timing at which the function can be rendered active has come, it is possible to prevent the function of the functional button 25 from being rendered active, and a situation in which the operation of the dicing apparatus 1 is unintentionally suspended to start an operation for replacing the cutting blade 41 can be avoided. As a result, the problem that the productivity is lowered can be prevented from occurring.

Note that, in the above embodiment, the timing at which the count-down by the count-down signal 252 is completed is 10 seconds after the start of touching of the functional button 25. However, the present invention is not limited to this. For example, the length of the time period from the start of touching of the functional button 25 through elongation of the count-down signal 252 until the completion of the count-down may be varied, for example, between 5 seconds and 10 seconds. If the length of the time period of the count-down by the count-down signal is fixed, repetition of the work would cause the operator to get used to it, and the effect of being a long-touch button may be lowered. Thus, the length of the count-down by the count-down signal 252 is changed, for example, at random every time the functional button 25 is touched, so that the operator is caused to pay attention so as not to touch a wrong functional button, and the effect of the present invention can be produced more. For the same reason as this, a display color of the count-down signal 252 may be varied. By changing the color of the count-down signal 252 at random every time the functional button 25 is touched, an erroneous operation that could happen because the operator gets used to the work or because of the operator's habit, for example, can be avoided as much as possible.

Figure 4A:
FIGS. 4A to 4E are conceptual diagrams depicting another embodiment of functional buttons of the touch panel depicted in FIG. 3.
Figure 4B:
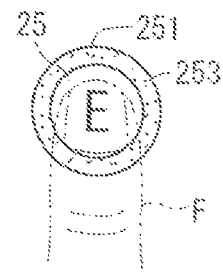
Figure 4C:
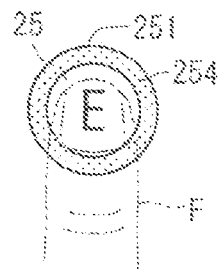
Figure 4D:
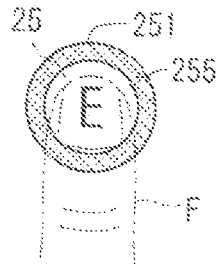
Figure 4E:
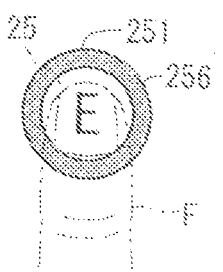

In addition, while the above embodiment describes an example in which the count-down signal 252 the count-down by which is started when the functional button 25 is touched goes around the functional button 25 which is a long-touch button, the present invention is not limited to this. It is only required for the count-down signal 252 to be at least displayed in a form attendant on the functional button 25 which is a long-touch button. For example, when the finger F of the operator touches the functional button 25 depicted in FIG. 4A, in the count-down signal display region 251, a count-down signal 253 which is in a predetermined color, for example, light blue near white is displayed as depicted in FIG. 4B. From this state, for example, as depicted in FIG. 4C, FIG. 4D, and FIG. 4E, colors of count-down signals 254 to 256 displayed in the count-down signal display region 251 are varied stepwise toward deeper blue on a two-second basis, with the deepest blue depicted in FIG. 4E, so that the operator can be notified that the timing at which the count-down by the count-down signal is completed has come. With use of such count-down signals 253 to 256, also, advantageous effects similar to those of the previously described embodiment can be obtained. In addition, in the case where the timing of the completion of the count down by the count-down signal displayed in the count-down signal display region 251 is notified by variation of color, the variation is not limited to gradations of a single color as in the example described above, and for example, changes of colors such as blue, green, yellow, and red may be used for notification.

While the above embodiment describes the example in which the functional button 25 is a long-touch button, all the functional buttons 21 to 26 may be long-touch buttons. Alternatively, only some of the functional buttons that could cause lowering of productivity when touched by mistake may be made as long-touch buttons.

The present invention is not limited to the details of the above described preferred embodiments. The scope of the invention is defined by the appended claims and all changes and modifications as fall within the equivalence of the scope of the claims are therefore to be embraced by the invention.

What is claimed is:

1. A semiconductor wafer dicing apparatus comprising:
a control unit including a computer, and
a touch panel that displays an image in which a plurality of functional buttons is arranged, and
a cutting unit having a cutting blade for cutting a semiconductor wafer,
wherein at least one functional button of the plurality of functional buttons is associated with processing of a workpiece in the semiconductor wafer dicing apparatus, wherein the workpiece is the semiconductor wafer,
wherein the plurality of functional buttons includes a long-touch button which renders a function active after the button is continuously touched for a predetermined time period, and attendant on the long-touch button, a count-down signal notifying a time period remaining before a timing at which the function can be rendered active is displayed, and
wherein attendant on the long-touch button executes the function comprising a procedure for replacing the cutting blade of the semiconductor wafer dicing apparatus,
wherein the function is rendered active in a case in which the timing has come and a finger is moved away from the long-touch button,
wherein the function is not rendered active in a case in which the finger is moved away from the long-touch button before the timing comes,
wherein the function is not rendered active in a case in which the timing has come, the finger is slid from the long-touch button without being moved away from the touch panel, and the finger is moved away from the touch panel at a position spaced from the long-touch button, and
wherein a length of the time period remaining before the timing comes changes every time the long-touch button is touched.

2. The semiconductor wafer dicing apparatus according to claim 1, wherein a color of the count-down signal changes every time the long-touch button is touched.

3. The semiconductor wafer dicing apparatus according to claim 1, wherein the count-down signal is displayed in such a manner as to go around the long-touch button.

4. The semiconductor wafer dicing apparatus according to claim 1, wherein the count-down signal display region is outlined along an inner perimeter and an outer perimeter of the count-down signal display region when the count-down signal is displayed, and
wherein the inner perimeter of the count-down signal display region is coincident with the perimeter of the long touch button.

5. The semiconductor wafer dicing apparatus according to claim 1, wherein a process being carried out by the processing apparatus is suspended when the function is rendered active.

6. The semiconductor wafer dicing apparatus according to claim 1, wherein the long-touch button is circular and the count-down display region is donut shaped around the long-touch button.

7. The semiconductor wafer dicing apparatus according to claim 6, wherein the count-down signal is gradually elongated in a clockwise manner around the long touch button.

8. The semiconductor wafer dicing apparatus according to claim 1, wherein the length of the time period before the timing comes increases or decreases randomly every time the long-touch button is touched.

* * * * *